US006982972B1

(12) United States Patent
Hirata

(10) Patent No.: US 6,982,972 B1
(45) Date of Patent: Jan. 3, 2006

(54) SIGNAL PROCESSOR IN MULTIPLEX COMMUNICATION SYSTEM UTILIZING A CHANGEOVER SIGNAL INDICATING A CHANGE IN GAIN OF THE TRANSMISSION SIGNAL AND THE SIGNAL PROCESSING METHOD FOR THE SYSTEM

(75) Inventor: Kenro Hirata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 785 days.

(21) Appl. No.: 09/926,658

(22) PCT Filed: Mar. 30, 2000

(86) PCT No.: PCT/JP00/02046

§ 371 (c)(1),
(2), (4) Date: Nov. 29, 2001

(87) PCT Pub. No.: WO01/76114

PCT Pub. Date: Oct. 11, 2001

(51) Int. Cl.
*H04B 7/216* (2006.01)

(52) U.S. Cl. ............... 370/335; 370/342; 375/146; 375/297

(58) Field of Classification Search ........... 370/204, 370/310, 328, 335, 342, 441; 375/130–150, 375/260, 295, 296, 297
See application file for complete search history.

(56) References Cited

U.S. PATENT DOCUMENTS 4,806,845 A * 2/1989 Nakano et al. ............. 324/613

6,240,071 B1 * 5/2001 Willenegger et al. ....... 370/311
6,269,113 B1 * 7/2001 Park .......................... 375/146

(Continued)

FOREIGN PATENT DOCUMENTS

JP   63-219215   9/1988

(Continued)

OTHER PUBLICATIONS

S. Kubota, et al., Denshi Joho Tsushin Gakkui Shunki Taikai Koen Ronbunshu, Bunsatsu 2 B-420, pp. 2-420, "Offset Gata Spectrum Kakusan Shingo No Denso Tokusei No Ichi Kento", Mar. 10, 1994.

*Primary Examiner*—Ricky Ngo
*Assistant Examiner*—Nguyen Ngo
(74) *Attorney, Agent, or Firm*—Oblon, Spivak, McClelland, Maier & Neustadt, P.C.

(57) ABSTRACT

A signal generating unit is arranged to generate a filter changeover signal a, which indicates the changeover from a plurality of waveform reshaping units of a first group corresponding to the reception of the modulated signals to a plurality of waveform reshaping units of a second group, in cases where an electric power gain value of the transmission signal is changed, to send the changeover signal a to the filter selecting unit, to generate a new gain signal of which a new electric power gain value is changed from an electric power gain value of the gain signal to send the new gain signal to the multipliers corresponding to the waveform reshaping units of the second group, and to successively send the gain signal having the electric power gain value to the multipliers corresponding to the waveform reshaping units of the first group during a prescribed time period after the change of the gain signal to the new gain signal.

20 Claims, 9 Drawing Sheets

U.S. PATENT DOCUMENTS

| | | | |
|---|---|---|---|
| 6,577,608 B1 * | 6/2003 | Moon et al. | 370/311 |
| 6,625,227 B1 * | 9/2003 | Shull et al. | 375/295 |
| 6,728,299 B2 * | 4/2004 | Jung et al. | 375/146 |
| 6,888,804 B1 * | 5/2005 | Moon | 370/311 |
| 2002/0009096 A1 * | 1/2002 | Odenwalder | 370/441 |
| 2003/0128680 A1 * | 7/2003 | Odenwalder et al. | 370/335 |

FOREIGN PATENT DOCUMENTS

| | | |
|---|---|---|
| JP | 3-224336 | 10/1991 |
| JP | 5-122265 | 5/1993 |
| JP | 10-224293 | 8/1998 |
| JP | 11-266168 | 9/1999 |

* cited by examiner

SIGNAL PROCESSOR IN MULTIPLEX COMMUNICATION SYSTEM UTILIZING A CHANGEOVER SIGNAL INDICATING A CHANGE IN GAIN OF THE TRANSMISSION SIGNAL AND THE SIGNAL PROCESSING METHOD FOR THE SYSTEM

This application is the national phase under 35 U.S.C. § 371 of PCT International Application No. PCT/JP00/02046 which has an International filing date of Mar. 30, 2000, which designated the United States of America and was not published in English.

TECHNICAL FIELD

The present invention relates to a signal processing device in a multiplex communication system, in which pieces of information are transmitted in a plurality of channels respectively, and a signal processing method performed in the system.

BACKGROUND ART

In a conventional signal processing device in a multiplex communication system, pieces of information are transmitted through a shared transmission path or space in a plurality of channels respectively. As an example of this type of multiplex communication system, communication systems based on frequency division multiple access (FDMA), time division multiple access (TDMA) and code division multiple access (CDMA) are known.

In particular, in case of the CDMA communication system, a plurality of users can share a frequency band. Therefore, as compared with the FDMA communication system and the TDMA communication system, the number of channels per a certain bandwidth can be increased. Also, because signals of a broad-band frequency are transmitted in the CDMA communication system, adverse influence of frequency selective fading due to multi-path signals is low. Therefore, it is expected that the CDMA communication system is useful for mobile communication.

In a CDMA communication system applied for the mobile communication, two pieces of information different from each other are, for example, transmitted from a mobile station in two channels respectively. For example, Published Unexamined Japanese Patent Application H11-266168 was laid open to public inspection on Sep. 28, 1999. In this patent application, method and device of adjusting an electric power of each transmission signal in the simultaneous transmission of both an audio signal and a data signal is disclosed.

FIG. 1 is a block diagram showing the configuration of a conventional signal processing device (or a base-band modulating device) in the CDMA communication system. In FIG. 1, 31 indicates a spreading modulating unit for performing a direct spreading modulation for two input signals of two channels CH1 and CH2 as a spreading modulation according to two pseudo noise signals input from Code 1 and Code 2. The spreading modulating unit 31 is composed of four exclusive OR gates 31a, 31b, 31c and 31d.

32 to 35 indicate waveform reshaping units for limiting four modulated signals sent from the spreading modulating unit 31. 36 to 39 indicate channel gain multipliers (hereinafter, called multipliers) for respectively multiplying a reshaped modulated signal sent from one of the waveform reshaping units 32 to 35 by a gain of a gain signal for each channel. 40 indicates an adder for adding together signals sent from the multipliers 36 and 37. 41 indicates an adder for adding together signals sent from the multipliers 38 and 39.

Next, an operation of the conventional signal processing device shown in FIG. 1 will be described below. Two types of signals (for example, an audio signal and a data signal) of two transmission channels CH1 and CH2 are received in the spreading modulating unit 31. The signal of the channel CH1 is received in the exclusive OR gates 31a and 31c, and the signal of the channel CH2 is received in the exclusive OR gates 31b and 31d.

Also, a pseudo noise signal of the Code 1 is received in the exclusive OR gates 31a and 31d, and a pseudo noise signal of the Code 2 is received in the exclusive OR gates 31b and 31c.

Therefore, the modulation of quadrature phase shift keying (QPSK) is performed for the two types of signals of the transmission channels CH1 and CH2 in the exclusive OR gates 31a to 31d, and a frequency band of each signal is spread to a spread frequency band which is tens times of the frequency band. In this case, the signals of the channels CH1 and CH2 are modulated in the exclusive OR gates 31a to 31d to produce two modulated signals $I_{CH1}$ and $I_{CH2}$ of an I component and two modulated signals $Q_{CH1}$ and $Q_{CH2}$ of a Q component according to following multiplication equations.

$$I_{CH1} = CH1 \times \text{Code 1}$$

$$I_{CH2} = -CH2 \times \text{Code 2}$$

$$Q_{CH1} = CH1 \times \text{Code 2}$$

$$Q_{CH2} = CH2 \times \text{Code 1}$$

The modulated signals $I_{CH1}$, $I_{CH2}$, $Q_{CH1}$ and $Q_{CH2}$ are orthogonal to each other. The modulated signals $I_{CH1}$, $I_{CH2}$, $Q_{CH1}$ and $Q_{CH2}$ spread in the exclusive OR gates 31a to 31d are input to the waveform reshaping units 32 to 35 respectively.

In the waveform reshaping units 32 to 35, waveforms of the modulated signals $I_{CH1}$, $I_{CH2}$, $Q_{CH1}$ and $Q_{CH2}$ are reshaped. In detail, an impulse response is superposed on each of the modulated signals $I_{CH1}$, $I_{CH2}$, $Q_{CH1}$ and $Q_{CH2}$ to limit the waveband of each modulated signal, and reshaped modulated signals $I'_{CH1}$, $I'_{CH2}$, $Q'_{CH1}$ and $Q'_{CH2}$ are produced and input to the multipliers 36, 37, 38 and 39.

In each of the multipliers 36, 37, 38 and 39, the reshaped modulated signal $I'_{CH1}$, $I'_{CH2}$, $Q'_{CH1}$ and $Q'_{CH2}$ is multiplied by a channel gain (or an electric power gain value) βd, βc, βd or βc of a gain signal sent from a signal generating unit (not shown) to produce an electric power controlled modulation signal $I'_{CH1}*\beta d$, $I'_{CH2}*\beta c$, $Q'_{CH1}*\beta d$ or $Q'_{CH2}*\beta c$.

Thereafter, two types of electric power controlled modulation signals $I'_{CH1}*\beta d$ and $I'_{CH2}*\beta c$ are received in the adder 40 and are added together according to a following equation. Therefore, a composite modulation signal Imod is produced. In the same manner, two types of electric power controlled modulation signals $Q'_{CH1}*\beta d$ and $Q'_{CH2}*\beta c$ are received in the adder 41 and are added together according to another following equation. Therefore, a composite modulation signal Qmod is produced. That is, the frequency spread modulation signal Imod of the I component and the frequency spread modulation signal Qmod of the Q component are produced.

$$Imode = \beta d * I'_{CH1} + \beta c * I'_{CH2}$$

$$Qmode = \beta d * Q'_{CH1} + \beta c * Q'_{CH2}$$

These frequency spread modulation signals Imod and Qmode are converted into analog signals in digital-to-analog converters (not shown) respectively and are input to high frequency modulating units (not shown) respectively. In each high frequency modulating unit, the analog signal is modulated with a high frequency carrier signal to produce a transmission signal, and the transmission signal is output as an electric wave.

In this case, to control an electric power of the transmission signal in the CDMA communication system, the channel gain is sometimes changed during the transmission of the signal.

FIG. 2 shows an example of the change of the channel gain $\beta d$ of the channel CH1 in the conventional signal processing device shown in FIG. 1. In cases where the channel gain $\beta d$ is periodically changed to $\beta d1$, $\beta d2$, $\beta d3$, $\beta d4$, - - - stepwise at constant time periods without changing the channel gain $\beta c$ of the channel CH2, an output signal (or an electric power controlled modulation signal) h' of the multiplier 36 and an output signal (or an electric power controlled modulation signal) k' of the multiplier 37 have waveforms of h' and k' shown in FIG. 2 respectively. Therefore, an output signal (or a composite modulation signal) m' of the adder 40 has a waveform of m' shown in FIG. 2, and an electric power value of the transmission signal is changed stepwise.

However, in the conventional signal processing device of the CDMA communication system, the band widths of the signals output from the waveform reshaping units 32 to 35 are limited, and the impulse response is superposed on the modulated signal at each sampling point in the waveform reshaping units 32 to 35. Therefore, there is a transient response in each output signal. Therefore, in cases where the channel gain is changed stepwise, the gain is sometimes changed in the middle of the impulse response. In this case, distortion occurs in the waveform of the transient response, and the bandwidth of the transmission signal is undesirably widened. Therefore, a problem has arisen that the leaking of an electric power of the transmission signal to a signal of an adjacent frequency channel is increased.

The present invention is provided to solve the above-described problem, and the object of the present invention is to provide a signal processing device and a signal processing method of the CDMA communication system in which the leaking of an electric power of a transmission signal to a signal of an adjacent frequency channel is suppressed even though a channel gain for the transmission signal is changed stepwise.

DISCLOSURE OF THE INVENTION

A signal processing device of a multiplex communication according to the present invention comprises waveform reshaping means (waveform reshaping units) of first and second groups for reshaping waveforms of the modulated signals to produce a plurality of reshaped modulation signals, selecting means (filter selecting unit) for selecting the waveform reshaping means of the first group or the waveform reshaping means of the second group according to a changeover signal (filter changeover signal) and receiving a plurality of modulated signals, multiplying means (channel multipliers) of the first and second groups, which correspond to the waveform reshaping means of the first and second groups respectively, for multiplying each reshaped modulation signal produced by the waveform reshaping means of the corresponding group by a gain signal for each of the first and second groups to produce a plurality of electric power controlled signals, adding means (channel adders) for adding together the electric power controlled signals produced by the multiplying means of the first and second groups to produce a composite modulation signal corresponding to a transmission signal, and signal generating means (channel gain setting unit) for generating the changeover signal, which indicates the changeover from the waveform reshaping means of the first group corresponding to the reception of the modulated signals to the waveform reshaping means of the second group, in cases where an electric power gain value of the transmission signal is changed, sending the changeover signal to the selecting means, generating a new gain signal of which a new electric power gain value is changed from an electric power gain value of the gain signal, sending the new gain signal to the multiplying means corresponding to the waveform reshaping means of the second group, and successively sending the gain signal having the electric power gain value to the multiplying means corresponding to the waveform reshaping means of the first group during a prescribed time period after the change of the gain signal to the new gain signal.

Therefore, even though a channel gain denoting an electric power gain value of the transmission signal is changed stepwise, no distortion occurs in a waveform of a transient response, and a band of the transmission signal is not widened. Accordingly, an electric power of the transmission signal can be prevented from being leaked to a signal of an adjacent frequency channel.

In a signal processing device of a multiplex communication according to the present invention, the gain signal having the electric power gain value is successively sent to the multiplying means corresponding to the waveform reshaping means of the first group by the signal generating means until a transient response of the waveform reshaping means of the first group is completed.

Therefore, even though a channel gain denoting an electric power gain value of the transmission signal is changed stepwise, distortion can be reliably prevented from occurring in a waveform of a transient response. Accordingly, a band of the transmission signal is not widened, and an electric power of the transmission signal can be prevented from being leaked to a signal of an adjacent frequency channel.

In a signal processing device of a multiplex communication according to the present invention, the changeover signal indicating the changeover of the waveform reshaping means is periodically generated by the signal generating means and is sent to the selecting means.

Therefore, even though a channel gain denoting an electric power gain value of the transmission signal is periodically changed, no distortion occurs in a waveform of a transient response, and a band of the transmission signal is not widened. Accordingly, an electric power of the transmission signal can be prevented from being leaked to a signal of an adjacent frequency channel.

In a signal processing device of a multiplex communication according to the present invention, the changeover signal indicating the changeover of the waveform reshaping means is sent to the selecting means by the signal generating means in response to the reception of an instruction which indicates the change of the electric power gain value of the transmission signal.

Therefore, even though a channel gain denoting an electric power gain value of the transmission signal is arbitrarily changed, no distortion occurs in a waveform of a transient response, and a band of the transmission signal is not widened. Accordingly, an electric power of the transmission signal can be prevented from being leaked to a signal of an adjacent frequency channel.

In a signal processing device of a multiplex communication according to the present invention, the information signals sent in a plurality of transmission channels are modulated by the modulating means to produce the modulated signals corresponding to a plurality of systems.

Therefore, in cases where pieces of information of a plurality of systems are simultaneously transmitted from a communication terminal device, even though a channel gain denoting an electric power gain value of the transmission signal is arbitrarily changed, no distortion occurs in a waveform of a transient response, and a band of the transmission signal is not widened. Accordingly, an electric power of the transmission signal can be prevented from being leaked to signals of the pieces of information of the systems near to that of the transmission signal.

In a signal processing device of a multiplex communication according to the present invention, the electric power controlled signals of the first and second groups are added together by the adding means to produce the composite modulation signal corresponding to the transmission signal which is transmitted from a mobile station to a base station.

Therefore, in cases where the signal processing device is applied for a mobile communication system, even though a channel gain denoting an electric power gain value of the transmission signal is arbitrarily changed, no distortion occurs in a waveform of a transient response, and a band of the transmission signal is not widened. Accordingly, an electric power of the transmission signal can be prevented from being leaked to a signal of an adjacent frequency channel.

A signal processing device of a multiplex communication according to the present invention comprises modulating means for performing a spreading modulation for a plurality of information signals sent in a transmission channel according to codes to produce a plurality of modulated signals for CDMA communication, waveform reshaping means of first and second groups for reshaping waveforms of the modulated signals to produce a plurality of reshaped modulation signals, selecting means for selecting the waveform reshaping means of the first group or the waveform reshaping means of the second group according to a changeover signal and receiving the modulated signals output from the modulating means, multiplying means of the first and second groups, which correspond to the waveform reshaping means of the first and second groups respectively, for multiplying each reshaped modulation signal produced by the waveform reshaping means of the corresponding group by a gain signal for each of the first and second groups to produce a plurality of electric power controlled signals, adding means for adding together the electric power controlled signals produced by the multiplying means of the first and second groups to produce a composite modulation signal corresponding to a transmission signal, and signal generating means for sending the changeover signal, which indicates the changeover from the waveform reshaping means of the first group corresponding to the reception of the modulated signals to the waveform reshaping means of the second group, to the selecting means in cases where an electric power gain value of the transmission signal is changed, generating a new gain signal of which a new electric power gain value is changed from an electric power gain value of the gain signal, sending the new gain signal to the multiplying means corresponding to the waveform reshaping means of the second group, and successively sending the gain signal having the electric power gain value to the multiplying means corresponding to the waveform reshaping means of the first group during a prescribed time period after the change of the gain signal to the new gain signal.

Therefore, in cases where the signal processing device is applied for a CDMA communication system, even though a channel gain denoting an electric power gain value of the transmission signal is changed stepwise, no distortion occurs in a waveform of a transient response, and a band of the transmission signal is not widened. Accordingly, an electric power of the transmission signal can be prevented from being leaked to a signal of an adjacent frequency channel.

A signal processing method of a multiplex communication according to the present invention comprises a step of reshaping waveforms of a plurality of modulated signals in waveform reshaping means of first and second groups, a step of selecting the waveform reshaping means of the first group or the waveform reshaping means of the second group according to a changeover signal, a step of receiving the modulated signals, a step of multiplying, in multiplying means of the first and second groups which correspond to the waveform reshaping means of the first and second groups respectively, each of a plurality of reshaped modulation signals received from the waveform reshaping means of the corresponding group by a received gain signal for each of the first and second groups to produce a plurality of electric power controlled signals of the first and second groups, a step of adding together the electric power controlled signals of the first and second groups to produce a composite modulation signal corresponding to a transmission signal, a step of generating the changeover signal, which indicates the changeover from the waveform reshaping means of the first group corresponding to the reception of the modulated signals to the waveform reshaping means of the second group, in cases where an electric power gain value of the transmission signal is changed, to select the waveform reshaping means of the second group, a step of generating a new gain signal of which a new electric power gain value is changed from an electric power gain value of the gain signal, a step of sending the new gain signal to the multiplying means corresponding to the waveform reshaping means of the second group, and a step of successively sending the gain signal having the electric power gain value to the multiplying means corresponding to the waveform reshaping means of the first group during a prescribed time period after the change of the gain signal to the new gain signal.

Therefore, even though a channel gain denoting an electric power gain value of the transmission signal is changed stepwise, no distortion occurs in a waveform of a transient response, and a band of the transmission signal is not widened. Accordingly, an electric power of the transmission signal can be prevented from being leaked to a signal of an adjacent frequency channel.

In a signal processing method of a multiplex communication according to the present invention, the gain signal having the electric power gain value is successively sent to the multiplying means corresponding to the waveform reshaping means of the first group in the step of generating the changeover signal and the gain signal until a transient response of the waveform reshaping means of the first group is completed.

Therefore, even though a channel gain denoting an electric power gain value of the transmission signal is changed stepwise, no distortion occurs in a waveform of a transient response, and a band of the transmission signal is not widened. Accordingly, an electric power of the transmission signal can be prevented from being leaked to a signal of an adjacent frequency channel.

In a signal processing method of a multiplex communication according to the present invention, the changeover signal indicating the changeover of the waveform reshaping means is periodically generated by the signal generating means in the step of generating the changeover signal and the gain signal.

Therefore, even though a channel gain denoting an electric power gain value of the transmission signal is periodically changed, no distortion occurs in a waveform of a transient response, and a band of the transmission signal is not widened. Accordingly, an electric power of the transmission signal can be prevented from being leaked to a signal of an adjacent frequency channel.

In a signal processing method of a multiplex communication according to the present invention, the changeover signal indicating the changeover of the waveform reshaping means is sent out to select the waveform reshaping means of the second group in the step of generating the changeover signal and the gain signal in response to the reception of an instruction which indicates the change of the electric power gain value of the transmission signal.

Therefore, even though a channel gain denoting an electric power gain value of the transmission signal is arbitrarily changed, no distortion occurs in a waveform of a transient response, and a band of the transmission signal is not widened. Accordingly, an electric power of the transmission signal can be prevented from being leaked to a signal of an adjacent frequency channel.

In a signal processing method of a multiplex communication according to the present invention, the information signals sent in a plurality of transmission channels are modulated in the step of producing the modulated signals.

Therefore, in cases where pieces of information of a plurality of systems are simultaneously transmitted from a communication terminal device, even though a channel gain denoting an electric power gain value of the transmission signal is arbitrarily changed, no distortion occurs in a waveform of a transient response, and a band of the transmission signal is not widened. Accordingly, an electric power of the transmission signal can be prevented from being leaked to signals of the pieces of information of the systems near to that of the transmission signal.

In a signal processing method of a multiplex communication according to the present invention, the electric power controlled signals of the first and second groups are added together, in the step of producing the composite modulation signal, to produce the composite modulation signal corresponding to the transmission signal which is transmitted from a mobile station to a base station.

Therefore, in cases where the signal processing device is applied for a mobile communication system, even though a channel gain denoting an electric power gain value of the transmission signal is arbitrarily changed, no distortion occurs in a waveform of a transient response, and a band of the transmission signal is not widened. Accordingly, an electric power of the transmission signal can be prevented from being leaked to a signal of an adjacent frequency channel.

In a signal processing method of a multiplex communication according to the present invention, a spreading modulation is performed for the information signals sent in the transmission channel according to codes in the step of producing the modulated signals to produce a plurality of modulated signals for CDMA communication.

Therefore, in cases where the signal processing device is applied for a CDMA communication system, even though a channel gain denoting an electric power gain value of the transmission signal is changed stepwise, no distortion occurs in a waveform of a transient response, and a band of the transmission signal is not widened. Accordingly, an electric power of the transmission signal can be prevented from being leaked to a signal of an adjacent frequency channel.

In a signal processing method of a multiplex communication according to the present invention, the composite modulation signal corresponding to the transmission signal, which is transmitted from a mobile station to a base station corresponding to the CDMA communication, is produced in the step of producing the composite modulation signal.

Therefore, in cases where the signal processing device is applied for a CDMA communication system, even though a channel gain denoting an electric power gain value of the transmission signal is changed stepwise, no distortion occurs in a waveform of a transient response, and a band of the transmission signal is not widened. Accordingly, an electric power of the transmission signal can be prevented from being leaked to a signal of an adjacent frequency channel.

BEST MODE FOR CARRYING OUT THE INVENTION

Hereinafter, the best mode for carrying out the present invention will now be described with reference to the accompanying drawings to explain the present invention in more detail.

Embodiment 1

Figure 1:
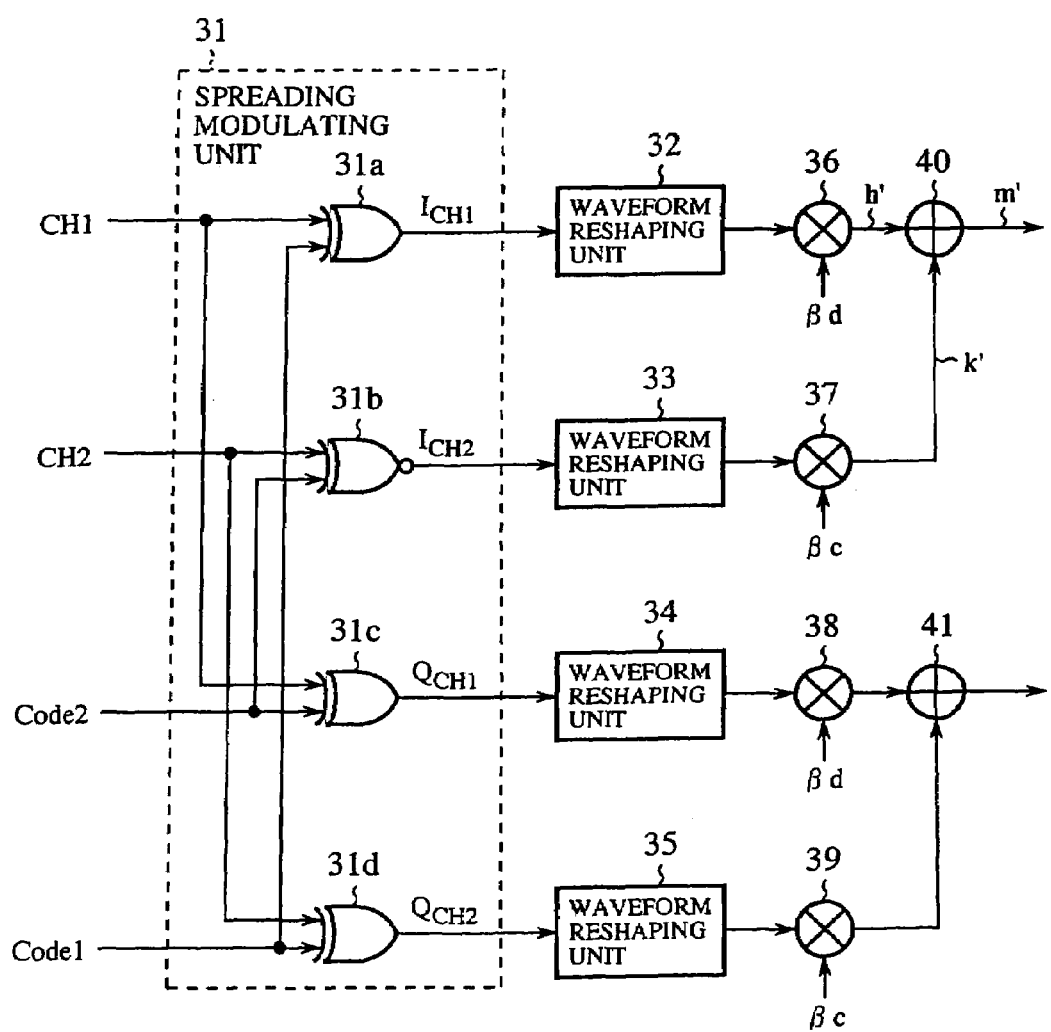
FIG. 1 is a block diagram of a conventional signal processing device in a CDMA communication system.
Figure 2:
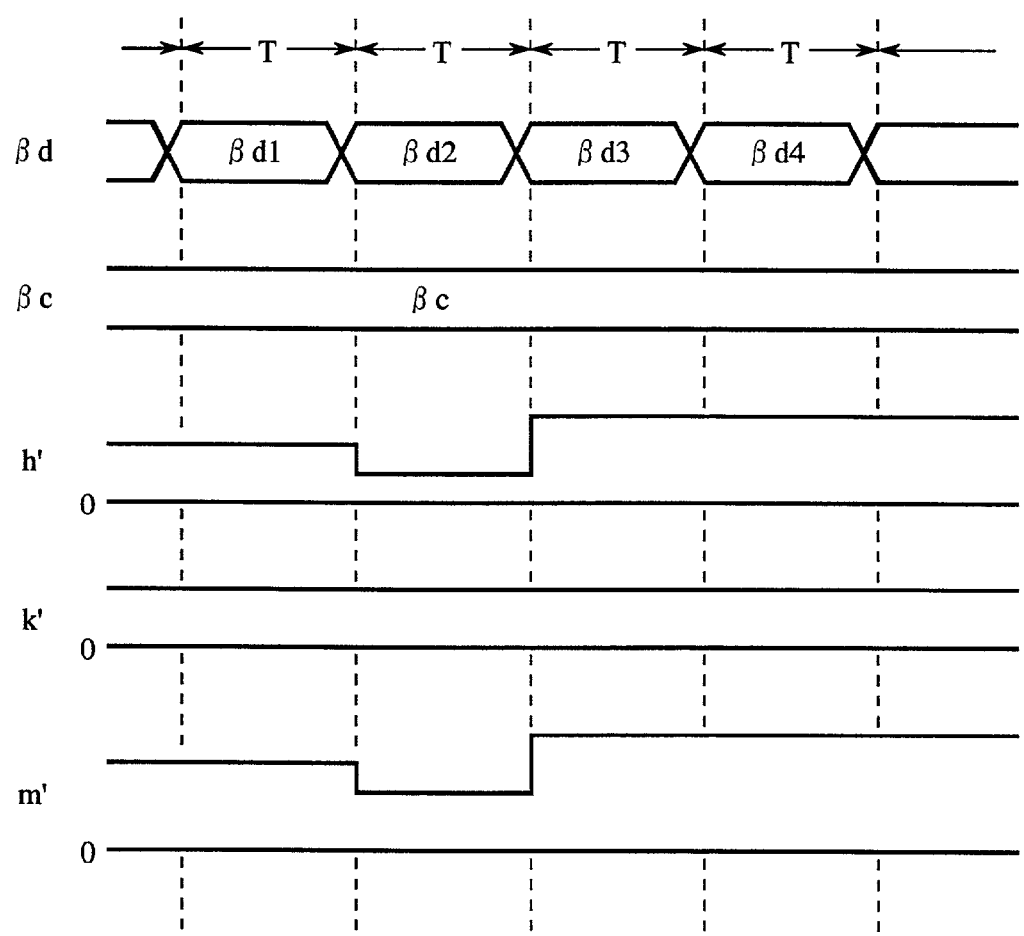
FIG. 2 is a view showing waveforms of signals shown in FIG. 1.
Figure 3:
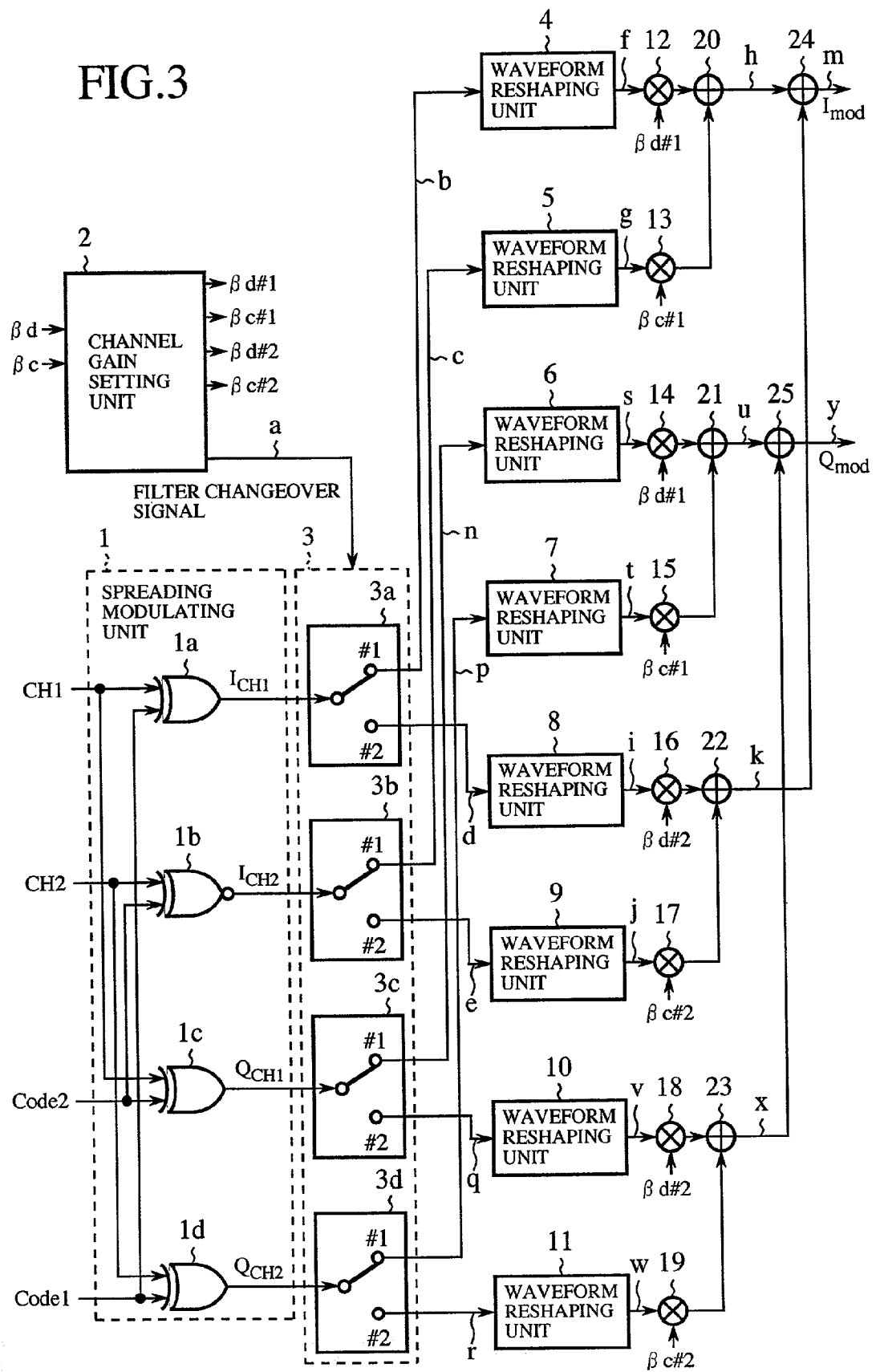
FIG. 3 is a block diagram of a signal processing device in a CDMA communication system according to a first embodiment of the present invention.

FIG. 3 is a block diagram of a signal processing device in a CDMA communication system according to a first embodiment of the present invention.

In FIG. 3, 1 indicates a spreading modulating unit for performing a direct spreading modulation for two input signals of two channels CH1 and CH2 as a spreading modulation according to two pseudo noise signals input from Code 1 and Code 2. The spreading modulating unit 1 is composed of four exclusive logical sum (OR) gates 1*a*, 1*b*, 1*c* and 1*d*. 2 indicates a channel gain setting unit for producing four channel gain setting signals of two groups and a filter changeover signal according to two channel gains βd and βc received from the outside.

3 indicates a filter selecting unit for selecting one of two groups according to the filter changeover signal received from the channel gain setting unit 2 and sending four modulated signals received from the spreading modulating unit 1 to the selected group. The filter selecting unit 3 is composed of four changeover switches 3a, 3b, 3c and 3d. 4 to 7 indicate four waveform reshaping units of one group (or a first group) for receiving the modulated signals from the filter selecting unit 3 in cases where the group is selected in the filter selecting unit 3. 8 to 11 indicate four waveform reshaping units of the other group (or a second group) for receiving the modulated signals from the filter selecting unit 3 in cases where the group is selected in the filter selecting unit 3.

12 to 19 indicate eight channel gain multipliers (hereinafter, called multipliers) for respectively multiplying a reshaped modulation signal, which is obtained by performing the waveform reshaping for one modulated signal in one of the waveform reshaping units 4 to 11, by a channel gain of one channel gain setting signal received from the channel gain setting unit 2. 20 indicates an adder for adding together signals received from the multipliers 12 and 13. 21 indicates an adder for adding together signals received from the multipliers 14 and 15. 22 indicates an adder for adding together signals received from the multipliers 16 and 17. 23 indicates an adder for adding together signals received from the multipliers 18 and 19. 24 indicates a channel adder (hereinafter, called an adder) for adding together signals received from the adders 20 and 22. 25 indicates a channel adder (hereinafter, called an adder) for adding together signals received from the adders 21 and 23.

Next, an operation of the signal processing device shown in FIG. 3 will be described below.

Two types of signals (for example, an audio signal and a data signal) of two transmission channels CH1 and CH2 are received in the spreading modulating unit 1. The signal of the channel CH1 is received in the exclusive OR gates 1a and 1c, and the signal of the channel CH2 is received in the exclusive OR gates 1b and 1d.

Also, a pseudo noise signal of the Code 1 is received in the exclusive OR gates 1a and 1d, and a pseudo noise signal of the Code 2 is received in the exclusive OR gates 1b and 1c.

Therefore, the QPSK modulation is performed for the two types of signals of the transmission channels CH1 and CH2 in the exclusive OR gates 1a to 1d, and a frequency band of each signal is spread to a spread frequency band which is tens times of the frequency band. In this case, the signals of the channels CH1 and CH2 are modulated in the exclusive OR gates 1a to 1d to produce four modulated signals $I_{CH1}$, $I_{CH2}$, $Q_{CH1}$ and $Q_{CH2}$ according to following multiplication equations.

$$I_{CH1} = CH1 \times Code\ 1$$

$$I_{CH2} = -CH2 \times Code\ 2$$

$$Q_{CH1} = CH1 \times Code\ 2$$

$$Q_{CH2} = CH2 \times Code\ 1$$

The modulated signals $I_{CH1}$, $I_{CH2}$, $Q_{CH1}$ and $Q_{CH2}$ are orthogonal to each other. The modulated signals $I_{CH1}$, $I_{CH2}$, $Q_{CH1}$ and $Q_{CH2}$ spread in the exclusive OR gates 1a to 1d are input to input contact points of the changeover switches 3a, 3b, 3c and 3d of the filter selecting unit 3 respectively. In the changeover switches 3a, 3b, 3c and 3d, the input contact points are connected with a group of output contact points #1 or a group of output contact points #2 according to the filter changeover signal sent from the channel gain setting unit 2. The output contact points #1 of the changeover switches 3a, 3b, 3c and 3d are connected with the waveform reshaping units 4, 5, 6 and 7 respectively, and the output contact points #2 of the changeover switches 3a, 3b, 3c and 3d are connected with the waveform reshaping units 8, 9, 10 and 11 respectively.

Therefore, in cases where the input contact points of the changeover switches 3a, 3b, 3c and 3d are connected with the output contact points #1, the modulated signals $I_{CH1}$, $I_{CH2}$, $Q_{CH1}$ and $Q_{CH2}$ are received in the waveform reshaping units 4, 5, 6 and 7 respectively in time sharing. Also, in cases where the input contact points of the changeover switches 3a, 3b, 3c and 3d are connected with the output contact points #2, the modulated signals $I_{CH1}$, $I_{CH2}$, $Q_{CH1}$ and $Q_{CH2}$ are received in the waveform reshaping units 8, 9, 10 and 11 respectively in time sharing.

In this case, a signal having an amplitude of 0 is supplied to one group of output contact points with which no input contact points are connected. Therefore, a data string of each modulated signal $I_{CH1}$, $I_{CH2}$, $Q_{CH1}$ or $Q_{CH2}$ output from the filter selecting unit 3 is expressed by a 2-bit data string in which one bit denoting the amplitude of 0 is added to the modulated signal $I_{CH1}$, $I_{CH2}$, $Q_{CH1}$ or $Q_{CH2}$.

Here, the modulated signals received in the waveform reshaping units 4, 5, 6 and 7 are expressed by $I_{CH1\#1}$, $I_{CH2\#1}$, $Q_{CH1\#1}$ and $Q_{CH2\#1}$ respectively, and the modulated signals received in the waveform reshaping units 8, 9, 10 and 11 are expressed by $I_{CH1\#2}$, $I_{CH2\#2}$, $Q_{CH1\#2}$ and $Q_{CH2\#2}$ respectively.

Thereafter, waveform reshaping is performed for the modulated signal $I_{CH1\#1}$ of the channel 1 and I component, the modulated signal $I_{CH2\#1}$ of the channel 2 and I component, the modulated signal $Q_{CH1\#1}$ of the channel 1 and Q component and the modulated signal $Q_{CH2\#1}$ of the channel 2 and Q component output from the filter selecting unit 3 in the waveform reshaping units 4, 5, 6 and 7, and waveform reshaping is performed for the modulated signal $I_{CH1\#2}$ of the channel 1 and I component, the modulated signal $I_{CH2\#2}$ of the channel 2 and I component, the modulated signal $Q_{CH1\#2}$ of the channel 1 and Q component and the modulated signal $Q_{CH2\#2}$ of the channel 2 and Q component output from the filter selecting unit 3 in the waveform reshaping units 8, 9, 10 and 11. Therefore, a multi-bit data string of a reshaped modulation signal satisfying a desired amplitude precision is output from each waveform reshaping unit. Here, the reshaped modulation signals output from the waveform reshaping units 4, 5, 6 and 7 are expressed by $I'_{CH1\#1}$, $I'_{CH2\#1}$, $Q'_{CH1\#1}$ and $Q'_{CH2\#1}$ respectively, and the reshaped modulation signals output from the waveform reshaping units 8, 9, 10 and 11 are expressed by $I'_{CH1\#2}$, $I'_{CH2\#2}$, $Q'_{CH1\#2}$ and $Q'_{CH2\#2}$ respectively.

Thereafter, the reshaped modulation signals output from the waveform reshaping units 4 to 11 are received in the multipliers 12 to 19 respectively. Also, channel gains of the channel gain setting signals output from the channel gain setting unit 2 are received in the multipliers 12 to 19 respectively.

That is, a channel gain βd#1 is received in the multiplier 12, a channel gain βc#1 is received in the multiplier 13, the channel gain βd#1 is received in the multiplier 14, the channel gain βc#1 is received in the multiplier 15, a channel gain βd#2 is received in the multiplier 16, a channel gain βc#2 is received in the multiplier 17, the channel gain βd#2 is received in the multiplier 18 and the channel gain.

βc#2 is received in the multiplier 19. Thereafter, the reshaped modulation signal is multiplied by the channel gain in each multiplier, and an electric power controlled modulation signal is output from each multiplier.

Thereafter, the electric power controlled modulation signals output from the multipliers 12 and 13 are added together in the adder 20, the electric power controlled modulation signals output from the multipliers 14 and 15 are added together in the adder 21, the electric power controlled modulation signals output from the multipliers 16 and 17 are added together in the adder 22, and the electric power controlled modulation signals output from the multipliers 18 and 19 are added together in the adder 23. Thereafter, an output of the adder 20 and an output of the adder 22 are added together in the adder 24, and an output of the adder 21 and an output of the adder 23 are added together in the adder 25.

As a result, a modulation signal Imod of the I component is output from the adder 24, and a modulation signal Qmod of the Q component is output from the adder 25. Therefore, The modulation signals Imod and Qmod are indicated according to following equations.

$$Imod = \beta d_{\#1} \times I'_{CH1\#1} + \beta c_{\#1} \times I'_{CH2\#1} + \beta d_{\#2} \times I'_{CH1\#2} + \beta c_{\#2} \times I'_{CH2\#2}$$

$$Qmod = \beta d_{\#1} \times Q'_{CH1\#1} + \beta c_{\#1} \times Q'_{CH2\#1} + \beta d_{\#2} \times Q'_{CH1\#2} + \beta c_{\#2} \times Q'_{CH2\#2}$$

In these equations, assuming that the channel gains are the same as each other, $$\beta d = \beta d_{\#1} = \beta d_{\#2}$$

$$\beta c = \beta c_{\#1} = \beta c_{\#2}$$

are set. Therefore, $$Imod = \beta d \times (I'_{CH1\#1} + I'_{CH1\#2}) + \beta c \times (I'_{CH2\#1} + I'_{CH2\#2})$$

$$Qmod = \beta d \times (Q'_{CH1\#1} + Q'_{CH1\#2}) + \beta c \times (Q'_{CH2\#1} + Q'_{CH2\#2})$$

are obtained. Also, $$I_{CH1} = I_{CH1\#1} + I_{CH1\#2}$$

$$I_{CH2} = I_{CH2\#1} + I_{CH2\#2}$$

$$Q_{CH1} = Q_{CH1\#1} + Q_{CH1\#2}$$

$$Q_{CH2} = Q_{CH2\#1} + Q_{CH2\#2}$$

are satisfied. Therefore, $$I'_{CH1} = I'_{CH1\#1} + I'_{CH1\#2}$$

$$I'_{CH2} = I'_{CH2\#1} + I'_{CH2\#2}$$

$$Q'_{CH1} = Q'_{CH1\#1} + Q'_{CH1\#2}$$

$$Q'_{CH2} = Q'_{CH2\#1} + Q'_{CH2\#2}$$

are obtained. Therefore, $$Imod = \beta d \times I'_{CH1} + \beta c \times I'_{CH2}$$

$$Qmod = \beta d \times Q'_{CH1} + \beta c \times Q'_{CH2}$$

are satisfied. Therefore, in cases where no channel gains are changed, the same modulation signals Imod and Qmode as those in the prior art are output from the signal processing device shown in FIG. 3.

Figure 4:
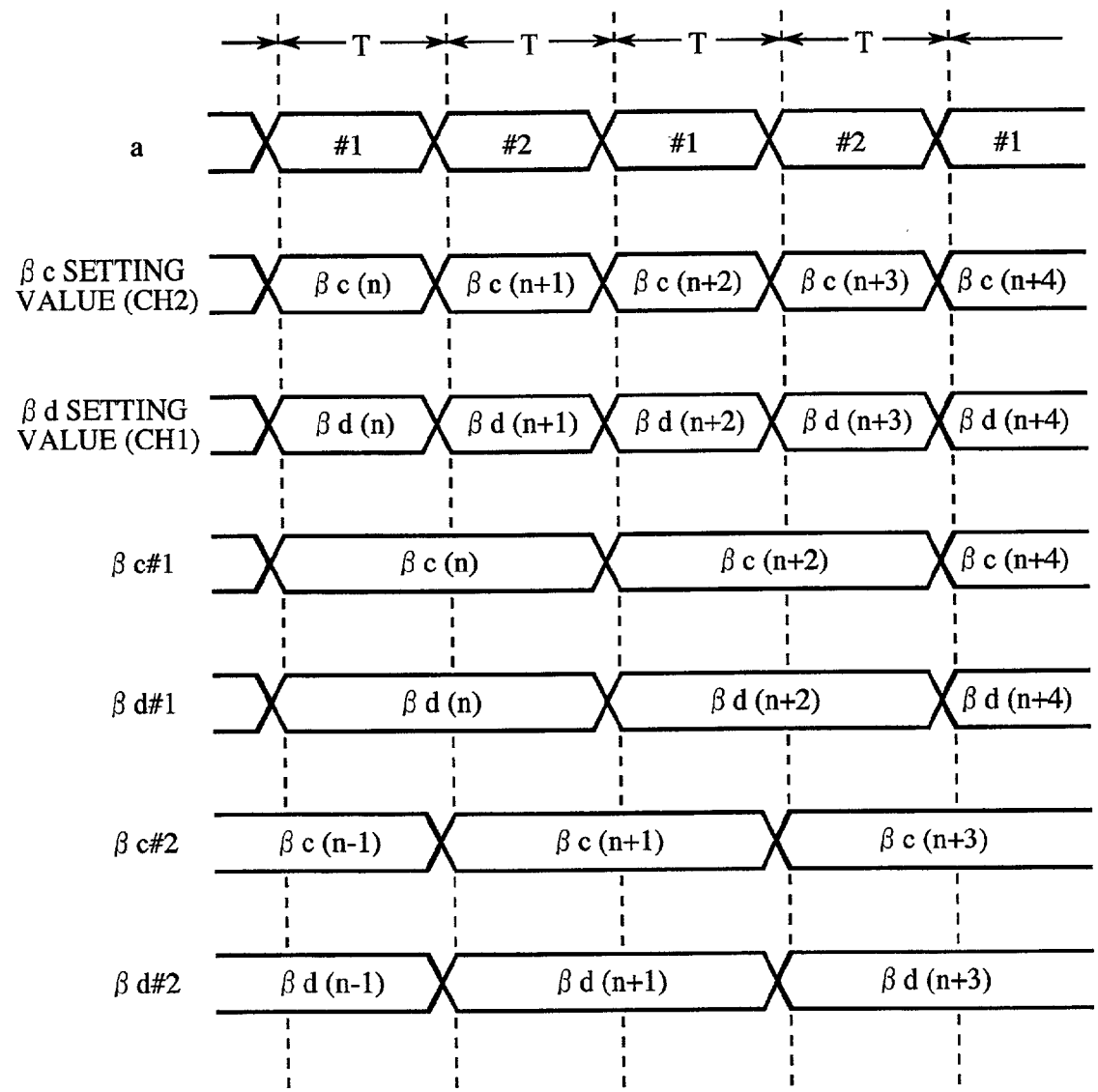
FIG. 4 is a view showing waveforms of signals shown in FIG. 3.

FIG. 4 is a view showing a filter changeover signal a sent from the channel gain setting unit 2 to the filter selecting unit 3 at constant periods T, changes of the channel gains βc and βd sent from the outside to the channel gain setting unit 2 at the constant periods T and changes of the channel gains $\beta c_{\#1}$, $\beta c_{\#2}$, $\beta d_{\#1}$ and $\beta d_{\#2}$ sent from the channel gain setting unit 2 to the multipliers 12 to 19.

As shown in FIG. 4, the channel gain βc is changed to βc(n), βc(n+1), βc(n+2), βc(n+3), βc(n+4), - - - one after another in that order every constant time period T, and the channel gain βd is changed to βd(n), βd(n+1), βd(n+2), βd(n+3), βd(n+4), - - - one after another in that order every constant time period T. In this case, it is not necessarily required to change a value (or an electric power gain value) of the channel gain every constant time period T. That is, it is applicable that the value of the channel gain be constant during a plurality of constant time periods.

In the time period T of the first cycle in FIG. 4, the filter changeover signal a of the channel gain setting unit 2 indicates the group of output contact points #1. That is, the filter changeover signal a indicates the selection of the waveform reshaping units 4, 5, 6 and 7 to which the modulated signals output from the spreading modulating unit 1 are input respectively. Also, the channel gains βc(n) and βd(n) are set as the channel gains $\beta c_{\#1}$ and $\beta d_{\#1}$ input to the multipliers 12, 13, 14 and 15 corresponding to the selected waveform reshaping units 4, 5, 6 and 7.

In the time period T of the second cycle, the filter changeover signal a of the channel gain setting unit 2 indicates the group of output contact points #2. That is, the filter changeover signal a indicates the selection of the waveform reshaping units 8, 9, 10 and 11 to which the modulated signals output from the spreading modulating unit 1 are input respectively. Also, the channel gains βc(n+1) and βd(n+1) are set as the channel gains $\beta c_{\#2}$ and $\beta d_{\#2}$ input to the multipliers 16, 17, 18 and 19 corresponding to the selected waveform reshaping units 8, 9, 10 and 11. In this case, the channel gains βc(n) and βd(n) in the first cycle are maintained during the time period T of the second cycle as the channel gains $\beta c_{\#1}$ and $\beta d_{\#1}$ input to the multipliers 12, 13, 14 and 15.

The channel gains βc and βd are maintained until the transient responses of the waveform reshaping units 4, 5, 6 and 7 (or the waveform reshaping units 8, 9, 10 and 11) are completed. Also, the time period T is equal to a changing cycle of the channel gains βc and βd or is equal to 1/N (N denotes a positive integral number) of the changing cycle of the channel gains βc and βd.

Figure 5:
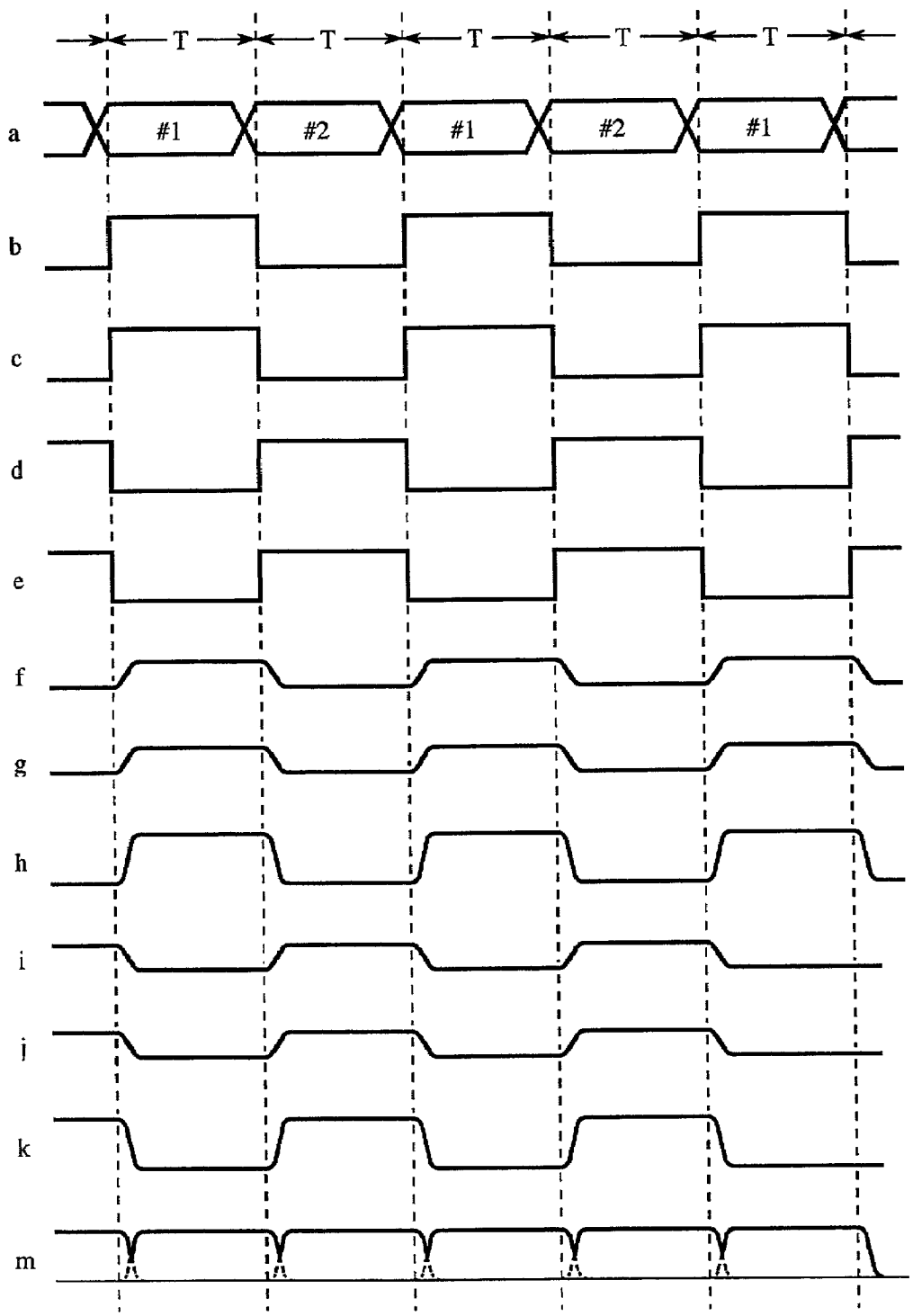
FIG. 5 is a view showing waveforms of signals shown in FIG. 3.
Figure 6:
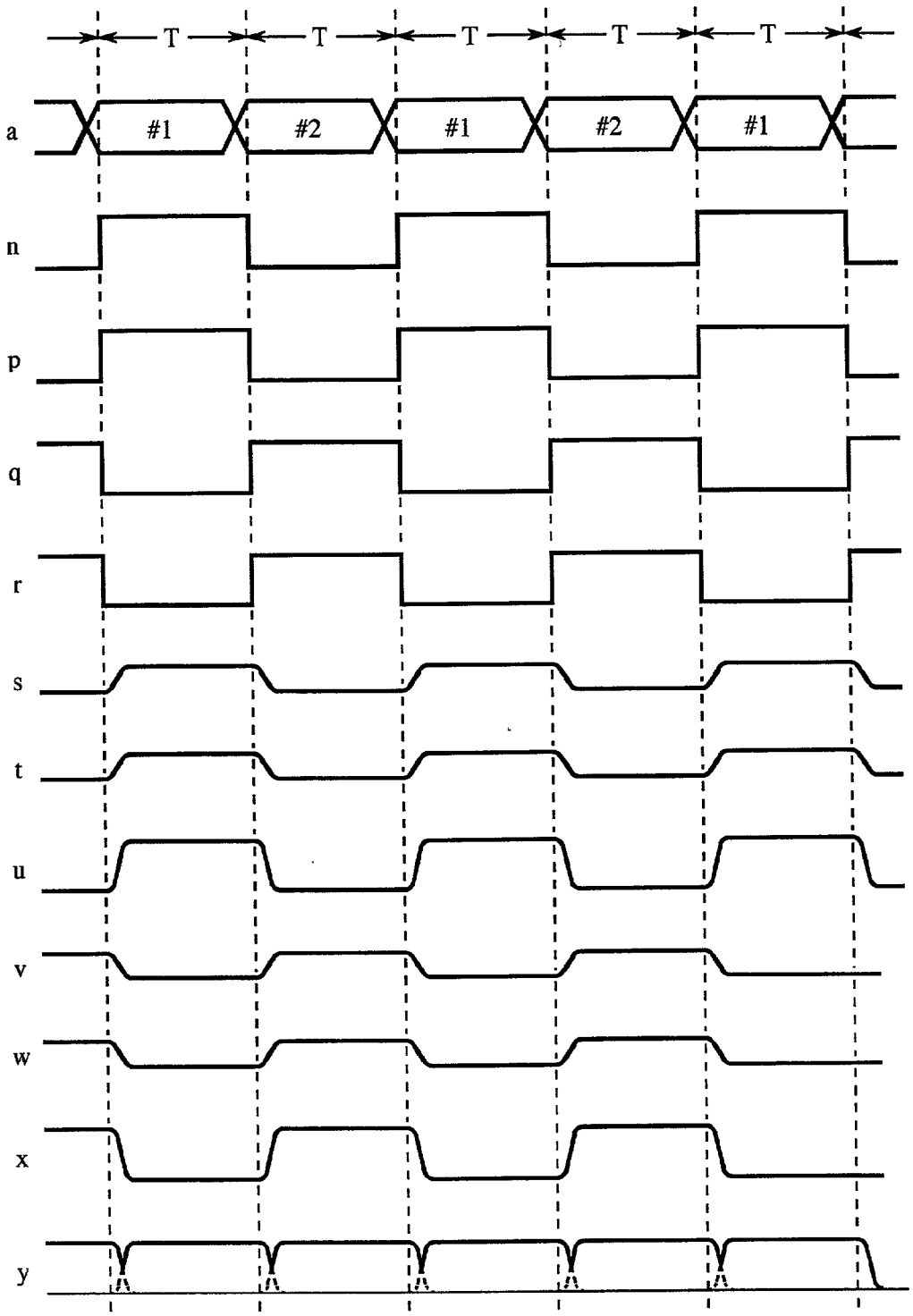
FIG. 6 is a view showing waveforms of signals shown in FIG. 3.

FIG. 5 and FIG. 6 are timing charts of signal waveforms in case of no change of the channel gains. Signs attached to the heads of the signal waveforms correspond to those attached to signal lines in FIG. 3. That is, the signal waveforms a to m in FIG. 5 indicate the filter changeover signal a of the channel gain setting unit 2, the signal b input to the waveform reshaping unit 4, the signal c input to the waveform reshaping unit 5, the signal d input to the waveform reshaping unit 8, the signal e input to the waveform reshaping unit 9, the signal f output from the waveform reshaping unit 4, the signal g output from the waveform reshaping unit 5, the signal h output from the adder 20, the signal i output from the waveform reshaping unit 8, the signal j output from the waveform reshaping unit 9, the signal k output from the adder 22 and the signal m output from the adder 24.

Also, the signal waveforms n to y in FIG. 6 indicate the signal n input to the waveform reshaping unit 6, the signal p input to the waveform reshaping unit 7, the signal q input to the waveform reshaping unit 10, the signal r input to the waveform reshaping unit 11, the signal s output from the waveform reshaping unit 6, the signal t output from the waveform reshaping unit 7, the signal u output from the adder 21, the signal v output from the waveform reshaping unit 10, the signal w output from the waveform reshaping unit 11, the signal x output from the adder 23 and the signal y output from the adder 25.

In FIG. 5 and FIG. 6, the group of output contact points #1 and the group of output contact points #2 are alternately indicated by the filter changeover signal a at the time periods T. Therefore, the sending of the input signals b, c, d and e to the group corresponding to the group of output contact points #1 and the sending of the input signals n, p, q and r to the group corresponding to the group of output contact points #2 are performed in the filter selecting unit 3 in time sharing. Also, a signal having an amplitude of 0 is input to each waveform reshaping unit during a time period in which no input signal is sent to the waveform reshaping unit. Thereafter, the waveforms of the input signals b, c, d, e, n, p, q and r are reshaped in the waveform reshaping units 4 to 11 respectively. In this case, as shown in the waveforms f, g, i, j, s, t, v and w, when the sending of the modulated signals from the filter selecting unit 3 is started, an output electric power of the reshaped modulation signal output from each waveform reshaping unit is increased according to a step response of the waveform reshaping unit and reaches a constant value in a stationary state. Thereafter, when the sending of the modulated signals from the filter selecting unit 3 is completed and a signal having an amplitude of 0 is sent to the waveform reshaping units, the output electric power of the reshaped modulation signal output from each waveform reshaping unit is decreased according to the step response of the waveform reshaping unit and reaches a constant value in a stationary state.

Thereafter, the output electric power of each reshaped modulation signal is multiplied by the corresponding channel gain in the corresponding multiplier 12 to 19, and adding results are obtained in the adders 20 to 23. The adding results are indicated by the waveforms of the signals h, k, u and x. Thereafter, the waveforms of the signals h and k output from the adders 20 and 22 are added together in the adder 24, and the waveform signal Imode (=m) denoting the I component of a modulation signal having an almost constant amplitude is produced. Also, the waveforms of the signals u and x output from the adders 21 and 23 are added together in the adder 25, and the waveform signal Qmode (=y) denoting the Q component of the modulation signal having the almost constant amplitude is produced.

Accordingly, the waveform signals Imode and Qmode of the same modulation signal as that obtained in the prior art, in which each reshaped modulation signal is multiplied by the same channel gain as that of the first embodiment, are obtained.

Figure 7:
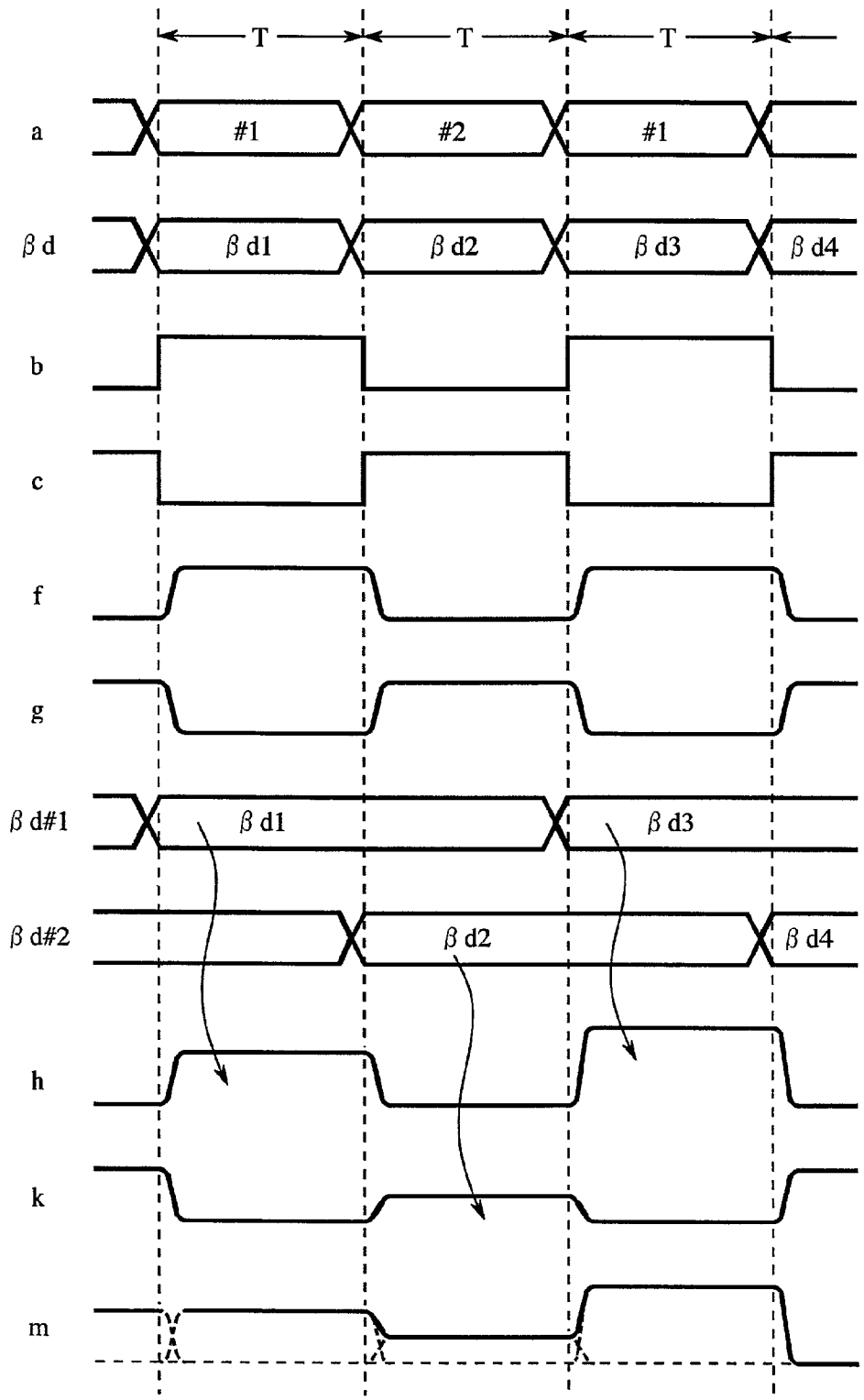
FIG. 7 is a view showing waveforms of signals shown in FIG. 3.

FIG. 7 is a view showing signal waveforms in case of the change of one channel gain. To simplify the description of the case shown in FIG. 7, the channel gain βd of the channel CH1 is changed to βd1, βd2, βd3 and βd4 one after another in that order every time period T in this case. That is, waveforms of signals relating to only the I component are shown in FIG. 7.

In the time period T of the first cycle in which the channel gain βd1 is received from the outside as the channel gain βd, the waveform reshaping unit 4 is selected to process the modulated signal of the I component in the channel CH1. A band limit is performed for the signal b input to the waveform reshaping unit 4 in this cycle, and the signal f is output from the waveform reshaping unit 4. Also, the channel gain βd1 is received in the multiplier 12 as the channel gain βd1#1 during both this cycle and a next cycle. A multiplied result of the multiplier 12 is included in the signal h output from the adder 20.

That is, as shown by arrows in FIG. 7, the channel gains βd1 and βd2 are incorporated in the signals h and k respectively, and the channel gains βd1 and βd2 are successively used for the multiplication until the transient response of the waveform reshaping unit 4 is completed. Therefore, no distortion occurs in the signal f output from the waveform reshaping unit 4, and the output signal h of the adder 20 is obtained by adding together both a signal, which is obtained by multiplying a band limited signal output from the waveform reshaping unit 4 by the channel gain βd1, and a signal output from the multiplier 12. In the same manner, the signal relating to the Q component of the channel CH1 is obtained.

As is described above, in the first embodiment, because all signals included in each cycle T are respectively multiplied by a channel gain, no distortion occurs in the signal output from each adder. Therefore, no distortion occurs in the signal output from the adder 24 as a result of the addition of the signals corresponding to the output contact points #1 and the signals corresponding to the output contact points #2. Accordingly, even though a channel gain is changed, each of the band width of the waveform signal Imode and the band width of the waveform signal Qmode is not widened. As a result, an electric power of a transmission signal can be prevented from being leaked to a signal of an adjacent frequency channel.

Embodiment 2

The configuration of a signal processing device according to a second embodiment is the same as that according to the first embodiment. Therefore, additional description of the signal processing device is omitted.

In the second embodiment, an operation of the channel gain setting unit 2 differs from that of the first embodiment. In the second embodiment, the filter changeover signal a is not sent to the filter selecting unit 3 at constant time periods, but the filter changeover signal a is sent to the filter selecting unit 3 when an instruction indicating a change of an electric power of a transmission signal is received in the channel gain setting unit 2.

Figure 8:
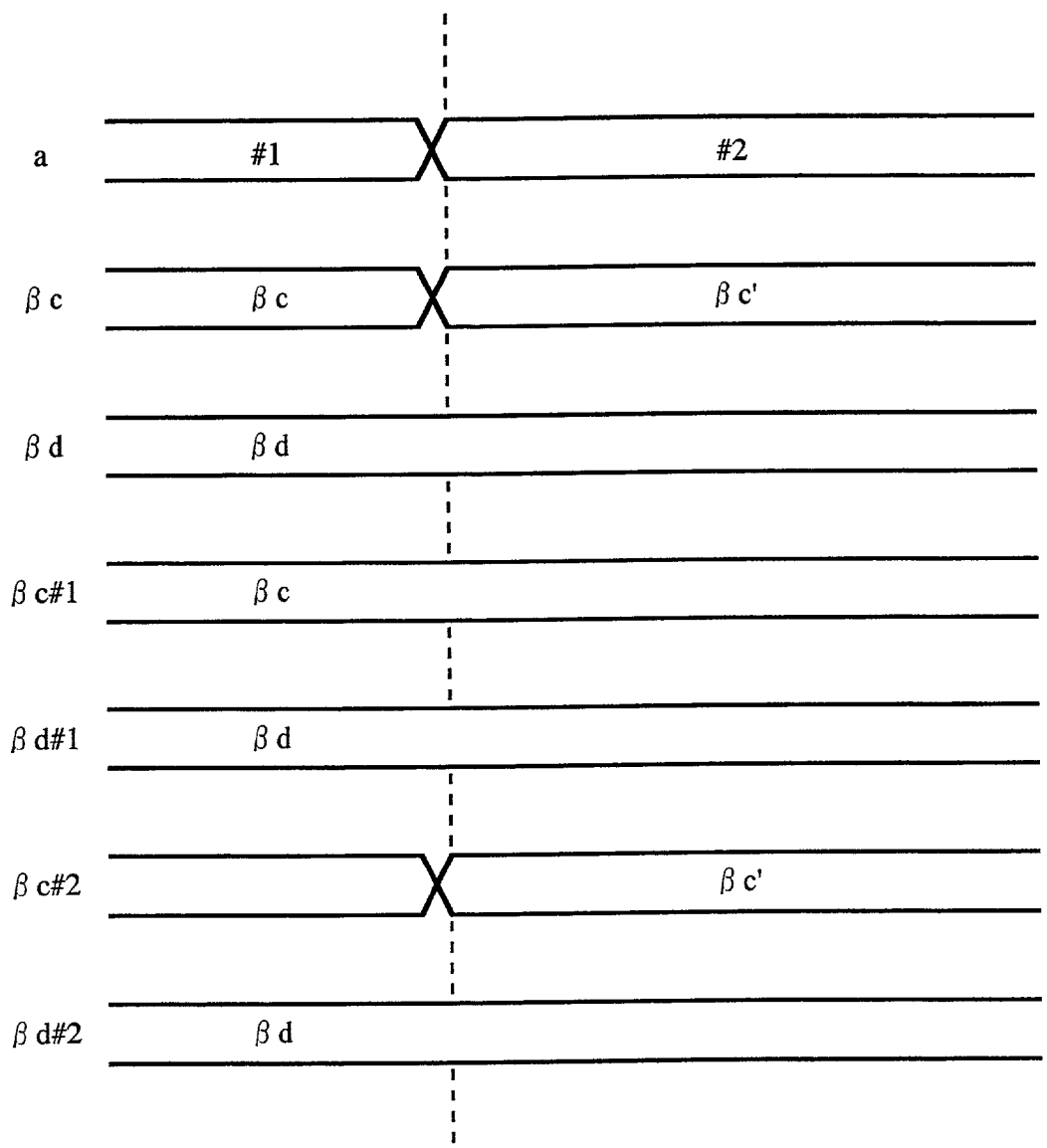
FIG. 8 is a view showing waveforms of signals shown in FIG. 3.

FIG. 8 shows a change of a value of the channel gain βc of the channel CH2.

The channel gains βc and βd input from the outside to the channel gain setting unit 2 are always monitored in the channel gain setting unit 2. When it is detected that a value of the channel gain βc or βd is changed to a new value, the filter changeover signal a indicating the selection of the output contact points #1 is changed to the filter changeover signal a indicating the selection of the output contact points #2 by the channel gain setting unit 2, and the value of the channel gain βc or βd received in the multiplier corresponding to each waveform reshaping unit, in which the modulated signal output from the spreading modulating unit 1 is received according to the changed filter changeover signal a, is changed to the new value of the changed channel gain βc or βd. For example, as shown in FIG. 8, the channel gain βc received in the channel gain setting unit 2 is changed to the channel gain βc', and the channel gain βc#2 received in the multiplier 19 is changed to the channel gain βc'.

Figure 9:
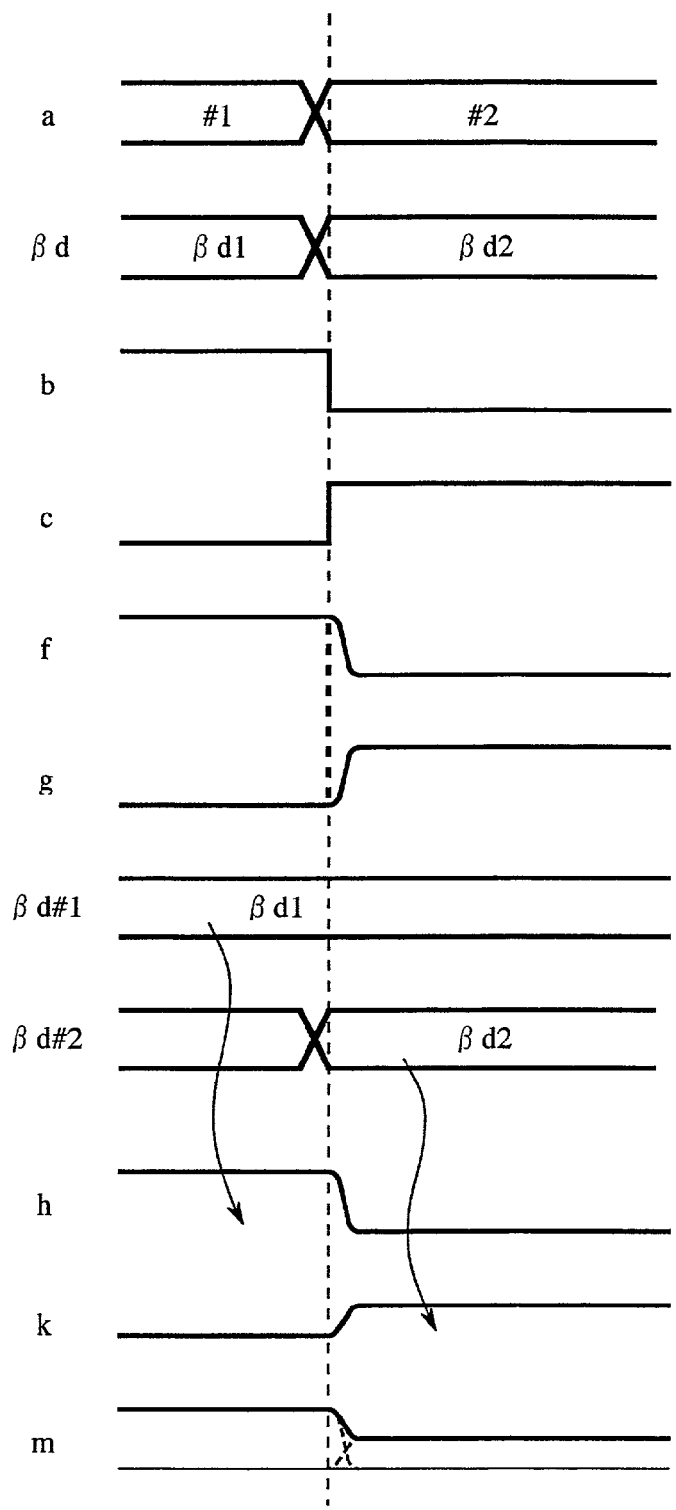
FIG. 9 is a view showing waveforms of signals shown in FIG. 3.

FIG. 9 shows waveforms of signals relating to the I component of the channel CH1 in case of a change of the channel gain βd from βd1 to βd2. a sign attached to a head of a waveform of each signal corresponds to a signal line of FIG. 3 indicated by the sign. In a time period of receiving the channel gain βd1 from the outside as the channel gain βd, the waveform reshaping unit 4 corresponding to the I component and the channel 1 is selected. Therefore, a band limit is performed for the modulated signal input to the waveform reshaping unit 4. Also, the channel gain βd1 is input to the multiplier 12 corresponding to the waveform reshaping unit 4 as the channel gain βd#1. The inputting of the channel gain βd1 to the multiplier 12 is continued after the change of the filter changeover signal a indicating the selection of the output contact points #1 to the filter changeover signal a indicating the selection of the output contact points #2.

As a result, as shown by arrows in FIG. 9, the channel gain βd1 input to the multiplier 12 is incorporated in the electric power of the signal h output from the adder 20, and the channel gain βd1 is successively used for the multiplication until the transient response of the waveform reshaping unit 4 is completed. Therefore, no distortion occurs in the signal f output from the waveform reshaping unit 4, and the output signal h of the adder 20 is obtained by adding together both a signal, which is obtained by multiplying a band limited signal output from the waveform reshaping unit 4 by the channel gain βd1, and a signal output from the multiplier 12. In the same manner, the signal relating to the Q component of the channel CH1 is obtained.

As is described above, in the second embodiment, even though the filter changeover signal a indicating the selection of the output contact points #1 is changed to the filter changeover signal a indicating the selection of the output contact points #2 when a value of a channel gain sent from the outside is changed to a new value, a signal output from each waveform reshaping unit corresponding to the output contact point #1 is multiplied, after the change of the filter changeover signal a, by the channel gain by which the signal is multiplied before the change of the filter changeover signal a. Therefore, no distortion occurs in the waveform of the signal output from each signal, and no distortion occurs in the signal output from the adder 24 as a result of the addition of the signals corresponding to the output contact points #1 and the signals corresponding to the output contact points #2. Accordingly, even though a channel gain is changed, each of the band width of the waveform signal Imode and the band width of the waveform signal Qmode is not widened.

In the first and second embodiments, each channel gain denoting an electric power gain value of a gain signal is received from the outside. However, it is applicable that the channel gains be stored in advance in the signal processing device.

Also, in the first and second embodiments, the present invention is described by adopting an example of the direct spreading in the CDMA communication system. However, it is applicable that a frequency hopping or another spreading be adopted.

Also, in the first and second embodiments, the signal processing device and the signal processing method in the CDMA communication system are described. However, a technical scope in the present invention is not limited to the CDMA communication system. That is, in addition to the FDMA communication system and the TDMA communication system, the present invention can be applied for all types of systems in which signal processing is performed for a signal, for which a band limit is performed by superposing an impulse response on the signal, while changing a gain for the signal stepwise. Therefore, even though the gain is changed during the impulse response, distortion can be prevented from occurring in a waveform of the signal.

INDUSTRIAL APPLICABILITY

As is described above, in the signal processing device and the signal processing method applied for the CDMA communication system, even though a channel gain denoting an electric power gain value of a gain signal is changed stepwise, no distortion occurs in a waveform of a transient response, and a band of a transmission signal is not widened. Therefore, the increase of an electric power leaked to a signal of an adjacent frequency channel can be suppressed. Accordingly, the signal processing device and the signal processing method are appropriate for the CDMA communication system and another type of multiplex communication system.

What is claimed is:

1. A signal processing device of a multiplex communication, comprising:
    modulating means for modulating a plurality of information signals of multiplex communication sent in a transmission channel to produce a plurality of modulated signals;
    waveform reshaping means of first and second groups for reshaping waveforms of the modulated signals to produce a plurality of reshaped modulation signals;
    selecting means for selecting the waveform reshaping means of the first group or the waveform reshaping means of the second group according to a changeover signal and receiving the modulated signals produced by the modulating means;
    multiplying means of the first and second groups, which correspond to the waveform reshaping means of the first and second groups respectively, for multiplying each reshaped modulation signal produced by the waveform reshaping means of the corresponding group by a gain signal for each of the first and second groups to produce a plurality of electric power controlled signals;
    adding means for adding together the electric power controlled signals produced by the multiplying means of the first and second groups to produce a composite modulation signal corresponding to a transmission signal; and
    signal generating means for generating the changeover signal, which indicates the changeover from the waveform reshaping means of the first group corresponding to the reception of the modulated signals to the waveform reshaping means of the second group, in cases where an electric power gain value of the transmission signal is changed, sending the changeover signal to the selecting means, generating a new gain signal of which a new electric power gain value is changed from an electric power gain value of the gain signal, sending the new gain signal to the multiplying means corresponding to the waveform reshaping means of the second group, and successively sending the gain signal having the electric power gain value to the multiplying means corresponding to the waveform reshaping means of the first group during a prescribed time period after the change of the gain signal to the new gain signal.

2. A signal processing device of a multiplex communication according to claim 1, wherein the gain signal having the electric power gain value is successively sent to the multiplying means corresponding to the waveform reshaping means of the first group by the signal generating means until a transient response of the waveform reshaping means of the first group is completed.

3. A signal processing device of a multiplex communication according to claim 1, wherein the changeover signal indicating the changeover of the waveform reshaping means is periodically generated by the signal generating means and is sent to the selecting means.

4. A signal processing device of a multiplex communication according to claim 1, wherein the changeover signal indicating the changeover of the waveform reshaping means is sent to the selecting means by the signal generating means in response to the reception of an instruction which indicates the change of the electric power gain value of the transmission signal.

5. A signal processing device of a multiplex communication according to claim 1, wherein the information signals sent in a plurality of transmission channels are modulated by the modulating means to produce the modulated signals corresponding to a plurality of systems.

6. A signal processing device of a multiplex communication according to claim 1, wherein the electric power controlled signals of the first and second groups are added together by the adding means to produce the composite modulation signal corresponding to the transmission signal which is transmitted from a mobile station to a base station.

7. A signal processing device of a multiplex communication, comprising:
    modulating means for performing a spreading modulation for a plurality of information signals sent in a transmission channel according to codes to produce a plurality of modulated signals for CDMA communication;
    waveform reshaping means of first and second groups for reshaping waveforms of the modulated signals to produce a plurality of reshaped modulation signals;
    selecting means for selecting the waveform reshaping means of the first group or the waveform reshaping means of the second group according to a changeover signal and receiving the modulated signals output from the modulating means;
    multiplying means of the first and second groups, which correspond to the waveform reshaping means of the first and second groups respectively, for multiplying each reshaped modulation signal produced by the waveform reshaping means of the corresponding group by a gain signal for each of the first and second groups to produce a plurality of electric power controlled signals;
    adding means for adding together the electric power controlled signals produced by the multiplying means of the first and second groups to produce a composite modulation signal corresponding to a transmission signal; and
    signal generating means for sending the changeover signal, which indicates the changeover from the waveform reshaping means of the first group corresponding to the reception of the modulated signals to the waveform reshaping means of the second group, to the selecting means in cases where an electric power gain value of the transmission signal is changed, generating a new gain signal of which a new electric power gain value is changed from an electric power gain value of the gain signal, sending the new gain signal to the multiplying means corresponding to the waveform reshaping means of the second group, and successively sending the gain signal having the electric power gain value to the multiplying means corresponding to the waveform reshaping means of the first group during a prescribed time period after the change of the gain signal to the new gain signal.

8. A signal processing device of a multiplex communication according to claim 7, wherein the gain signal having the electric power gain value is successively sent to the multiplying means corresponding to the waveform reshaping means of the first group by the signal generating means until a transient response of the waveform reshaping means of the first group is completed.

9. A signal processing device of a multiplex communication according to claim 7, wherein the changeover signal indicating the changeover of the waveform reshaping means is periodically generated by the signal generating means and is sent to the selecting means.

10. A signal processing device of a multiplex communication according to claim 7, wherein the changeover signal indicating the changeover of the waveform reshaping means is generated and sent to the selecting means by the signal generating means in response to the reception of an instruction which indicates the change of the electric power gain value of the transmission signal.

11. A signal processing device of a multiplex communication according to claim 7, wherein the spreading modulation is performed for the information signals sent in a plurality of transmission channels by the modulating means.

12. A signal processing device of a multiplex communication according to claim 7, wherein the electric power controlled signals of the first and second groups are added together by the adding means to produce the composite modulation signal corresponding to the transmission signal which is transmitted from a mobile station to a base station corresponding to the CDMA communication.

13. A signal processing method of a multiplex communication, comprising:
    a step of modulating a plurality of information signals of multiplex communication sent in a transmission channel to produce a plurality of modulated signals;
    a step of reshaping waveforms of the modulated signals in waveform reshaping means of first and second groups;
    a step of selecting the waveform reshaping means of the first group or the waveform reshaping means of the second group according to a changeover signal;
    a step of receiving the modulated signals;
    a step of multiplying, in multiplying means of the first and second groups which correspond to the waveform reshaping means of the first and second groups respectively, each of a plurality of reshaped modulation signals received from the waveform reshaping means of the corresponding group by a received gain signal for each of the first and second groups to produce a plurality of electric power controlled signals of the first and second groups;
    a step of adding together the electric power controlled signals of the first and second groups to produce a composite modulation signal corresponding to a transmission signal;
    a step of generating the changeover signal, which indicates the changeover from the waveform reshaping means of the first group corresponding to the reception of the modulated signals to the waveform reshaping means of the second group, in cases where an electric power gain value of the transmission signal is changed, to select the waveform reshaping means of the second group;

a step of generating a new gain signal of which a new electric power gain value is changed from an electric power gain value of the gain signal;

a step of sending the new gain signal to the multiplying means corresponding to the waveform reshaping means of the second group; and a step of successively sending the gain signal having the electric power gain value to the multiplying means corresponding to the waveform reshaping means of the first group during a prescribed time period after the change of the gain signal to the new gain signal.

14. A signal processing method of a multiplex communication according to claim 13, wherein the gain signal having the electric power gain value is successively sent to the multiplying means corresponding to the waveform reshaping means of the first group in the step of generating the changeover signal and the gain signal until a transient response of the waveform reshaping means of the first group is completed.

15. A signal processing method of a multiplex communication according to claim 13, wherein the changeover signal indicating the changeover of the waveform reshaping means is periodically generated by the signal generating means in the step of generating the changeover signal and the gain signal.

16. A signal processing method of a multiplex communication according to claim 13, wherein the changeover signal indicating the changeover of the waveform reshaping means is sent out to select the waveform reshaping means of the second group in the step of generating the changeover signal and the gain signal in response to the reception of an instruction which indicates the change of the electric power gain value of the transmission signal.

17. A signal processing method of a multiplex communication according to claim 13, wherein the information signals sent in a plurality of transmission channels are modulated in the step of producing the modulated signals.

18. A signal processing method of a multiplex communication according to claim 13, wherein the electric power controlled signals of the first and second groups are added together, in the step of producing the composite modulation signal, to produce the composite modulation signal corresponding to the transmission signal which is transmitted from a mobile station to a base station.

19. A signal processing method of a multiplex communication according to claim 13, wherein a spreading modulation is performed for the information signals sent in the transmission channel according to codes in the step of producing the modulated signals to produce a plurality of modulated signals for CDMA communication.

20. A signal processing method of a multiplex communication according to claim 18, wherein the composite modulation signal corresponding to the transmission signal, which is transmitted from a mobile station to a base station corresponding to the CDMA communication, is produced in the step of producing the composite modulation signal.

* * * * *